United States Patent
Tang et al.

(10) Patent No.: US 10,002,933 B1
(45) Date of Patent: Jun. 19, 2018

(54) SEMICONDUCTOR DEVICE STRUCTURE WITH CAP LAYER WITH TOP AND BOTTOM PORTIONS OVER GATE ELECTRODE

(71) Applicant: Taiwan Semiconductor Manufacturing Co., Ltd., Hsinchu (TW)

(72) Inventors: Bang-Tai Tang, New Taipei (TW); Tai-Chun Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/469,835

(22) Filed: Mar. 27, 2017

(51) Int. Cl.
*H01L 21/70* (2006.01)
*H01L 29/423* (2006.01)
*H01L 29/66* (2006.01)

(52) U.S. Cl.
CPC .. *H01L 29/42356* (2013.01); *H01L 29/66545* (2013.01); *H01L 29/66553* (2013.01)

(58) Field of Classification Search
CPC ......... H01L 29/42356; H01L 29/66545; H01L 29/66553; H01L 21/28247; H01L 29/42364; H01L 29/78; H01L 29/517; H01L 29/66795; H01L 29/0847; H01L 21/31144; H01L 29/6653; H01L 21/76832; H01L 21/28008; H01L 29/518
USPC ......... 257/288, 368, 369; 438/151, 197, 199
See application file for complete search history.

(56) References Cited

U.S. PATENT DOCUMENTS

| | | | |
|---|---|---|---|
| 2014/0197468 A1* | 7/2014 | Xie | H01L 29/78 257/288 |
| 2015/0041869 A1* | 2/2015 | Pham | H01L 29/78 257/288 |
| 2015/0364326 A1* | 12/2015 | Xie | H01L 29/665 257/288 |
| 2016/0247888 A1* | 8/2016 | Kerber | H01L 29/66545 |

* cited by examiner

*Primary Examiner* — Shahed Ahmed
(74) *Attorney, Agent, or Firm* — McClure, Qualey & Rodack, LLP (57) ABSTRACT

A semiconductor device structure and method for forming the same are provided. The semiconductor device structure includes a gate stack structure formed over a substrate, and the gate stack structure includes a bottom portion and a top portion. The bottom portion includes a gate electrode layer formed over a substrate. The top portion includes a protection layer formed over the gate electrode layer, a stop layer formed over the protection layer, and the stop layer is surrounded by the protection layer. A cap layer is formed over the stop layer, and the cap layer is surrounded by the stop layer.

19 Claims, 9 Drawing Sheets

SEMICONDUCTOR DEVICE STRUCTURE WITH CAP LAYER WITH TOP AND BOTTOM PORTIONS OVER GATE ELECTRODE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure with a metal gate structure and method for forming the same are provided. FIGS. 1A-1K show cross-sectional representations of various stages of forming a semiconductor device structure 100, in accordance with some embodiments of the disclosure.

Figure 1A:
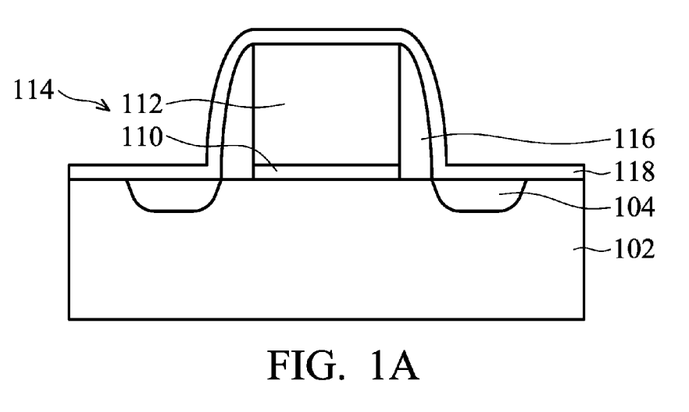
FIGS. 1A-1K show cross-sectional representations of various stages of forming a semiconductor device structure, in accordance with some embodiments of the disclosure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 includes source/drain (S/D) structures 104. The S/D structures 104 may apply strain or stress on the channel region between the S/D structures 104 to improve the carrier mobility. The S/D structures 104 are formed by doped regions. In some embodiments, the S/D structures 104 are doped with an n-type dopant, such as arsenic (As), phosphorous (P) or antimony (Sb). In some other embodiments, the S/D structures 104 are doped with a p-type dopant, such as boron (B) or boron fluorine ($BF_2$).

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structures. In some embodiments, the isolation structure includes silicon oxide, silicon nitride, silicon oxynitride, fluoride-doped silicate glass (FSG), or another suitable material.

A dummy gate dielectric layer 110 is formed over the substrate 102. In some embodiments, the dummy gate dielectric layer 110 is made of silicon oxide, silicon nitride, silicon oxynitride, dielectric material with high dielectric constant (high-K), another suitable dielectric material, or a combination thereof. In some embodiments, the dummy gate dielectric layer 110 will subsequently be removed. In some other embodiments, the dummy gate dielectric layer 110 is not formed. In some embodiments, the dummy gate dielectric layer 110 is deposited using a chemical vapor deposition (CVD) process, an atomic layer deposition (ALD) process, a thermal oxidation process, a physical vapor deposition (PVD) process, another applicable process, or a combination thereof.

Afterwards, a dummy gate electrode layer 112 is formed over the dummy gate dielectric layer 110, and the dummy gate dielectric layer 110 and the dummy gate electrode layer 112 construct a gate stack structure 114. In some embodiments, the dummy gate electrode 112 is made of polysilicon. In some embodiments, the portion of the substrate 102 under the dummy gate electrode layer 112 serves as a channel region of a transistor device structure. In some embodiments, the dummy gate electrode layer 112 is formed by a chemical vapor deposition (CVD) process, a physical vapor deposition (PVD) process, another applicable process, or a combination thereof.

The dummy gate dielectric layer 110 and the dummy gate electrode layer 112 are formed by a patterning process. The patterning process includes a photolithography process and an etching process. The photolithography process includes photoresist coating (e.g., spin-on coating), soft baking, mask aligning, exposure, post-exposure baking, developing the photoresist, rinsing, and drying (e.g., hard baking). The etching process includes a dry etching process or a wet etching process.

The spacer layers 116 are formed on opposite sidewalls of the gate stack structure 114. The spacer layers 116 may include multiple layers. The spacer layers 116 may be used to protect the gate stack structure 114. In some embodiments, the outer surface of the spacer layers 116 are aligned with the outer surfaces of the source/drain (S/D) structures 104.

In some embodiments, the spacer layers 116 are made of a dielectric material. In some embodiments, the spacer layers 116 are made of silicon oxide, silicon nitride, silicon oxynitride, another applicable material or a combination thereof. In some embodiments, the spacer layers 116 are formed by a chemical vapor deposition (CVD) process, a physical vapor deposition (PVD) process or another applicable process.

Afterwards, a contact etching stop layer (CESL) 118 is formed over the spacer layers 116, the gate stack structure 114 and the substrate 102. The contact etching stop layer (CESL) 118 may include silicon nitride, carbon-doped silicon nitride, or another applicable material. In some embodiments, the contact etching stop layer (CESL) 118 is formed by a chemical vapor deposition (CVD) process, a physical vapor deposition (PVD) process or another applicable process.

Some device elements may be formed over the substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

Figure 1B:
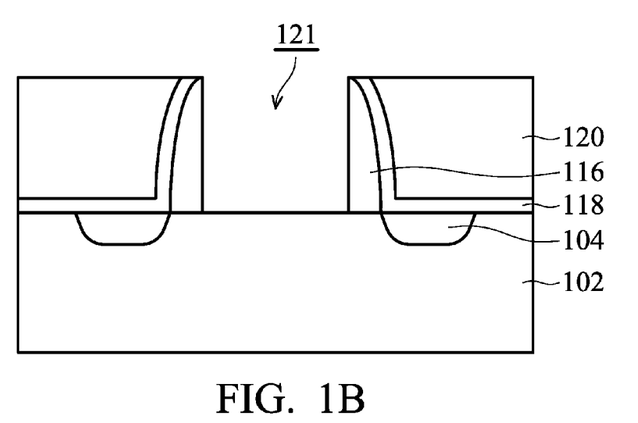

Next, as shown in FIG. 1B, a dielectric layer is formed over the contact etching stop layer (CESL) 118 and the gate stack structure 114, in accordance with some embodiments of the disclosure. Afterwards, a portion of the dielectric layer is removed to expose a top surface of the gate electrode layer 112. As a result, an inter-layer dielectric (ILD) layer 120 is formed to surround the gate stack structure 114. In some embodiments, the portion of the dielectric layer is removed by a planarizing process, such as a chemical mechanical polishing (CMP) process.

The ILD layer 120 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 120 may be formed by a chemical vapor deposition (CVD), a physical vapor deposition, (PVD), an atomic layer deposition (ALD), a spin-on coating, or another applicable process.

Afterwards, the gate stack structure 114 is removed to form a trench 121 in the ILD layer 120. The trench 121 is surrounded by the spacer layers 116 and the CESL 118. In some embodiments, the gate stack structure 114 is removed by an etching process, such as a dry etching process.

Figure 1C:
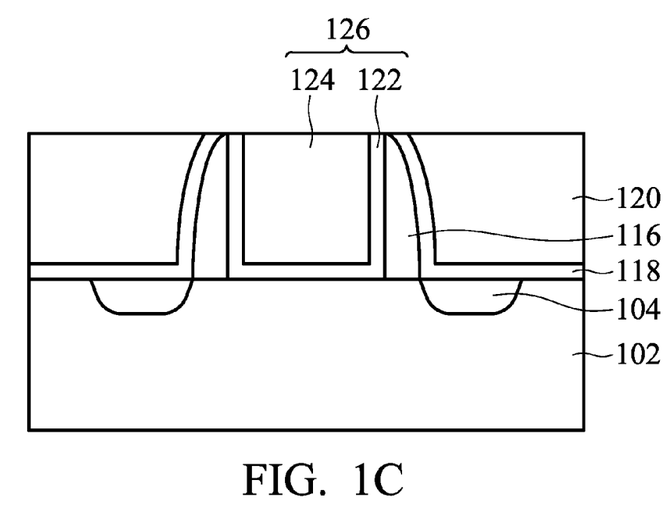

Next, as shown in FIG. 1C, a gate dielectric layer 122 is conformally formed in the trench 121, and then a gate electrode layer 124 is formed over the gate dielectric layer 122, in accordance with some embodiments of the disclosure. A gate structure 126 is constructed by the gate dielectric layer 122 and the gate electrode layer 124.

The gate dielectric layer 122 is made of silicon oxide, silicon nitride, or a high dielectric constant material (high-k material). Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 122 is deposited using a chemical vapor deposition (CVD) process, an atomic layer deposition (ALD) process, a thermal oxidation process, a physical vapor deposition (PVD) process, another applicable process, or a combination thereof.

The gate electrode layer 124 is made of conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, the gate electrode layer 124 is formed by a chemical vapor deposition (CVD) process or a physical vapor deposition (PVD) process.

Figure 1D:
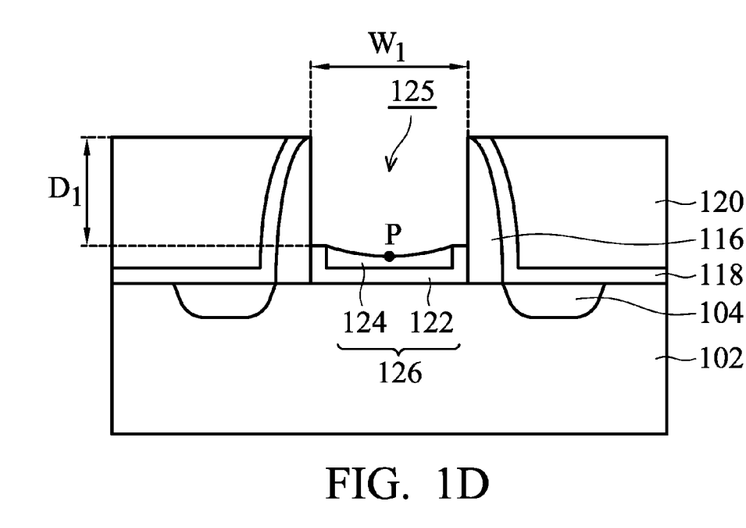

Afterwards, as shown in FIG. 1D, a portion of the gate structure 126 is removed to form an opening 125, in accordance with some embodiments of the disclosure. More specifically, the portion of the gate structure 126 is etched back by an etching process. As a result, a top surface of the gate structure 126 is lower than a top surface of the ILD layer 120, and lower than a top surface of the spacer layer 116. In some embodiments, a top surface of the gate structure 126 is has a recessed surface. A middle point P of the top surface of the gate structure 126 is the lowest point. The gate electrode layer 124 is surrounded by the U-shaped gate dielectric layer 122 when seen from a cross-sectional view.

The opening 125 has a first depth D1 measured from a top surface of the ILD layer 120 to a topmost surface of the gate electrode layer 124, and it has a first width W1 measured from a left sidewall to a right sidewall of the opening 125. In some embodiments, the first depth D1 of the opening 125 is in a range from about 60 to about 70 nm. In some embodiments, the first width W1 of the opening 125 is in a range from about 10 to about 20 nm. In some embodiments, the aspect ratio of the opening 125 is in a range from about 3 to about 7.

Figure 1E:
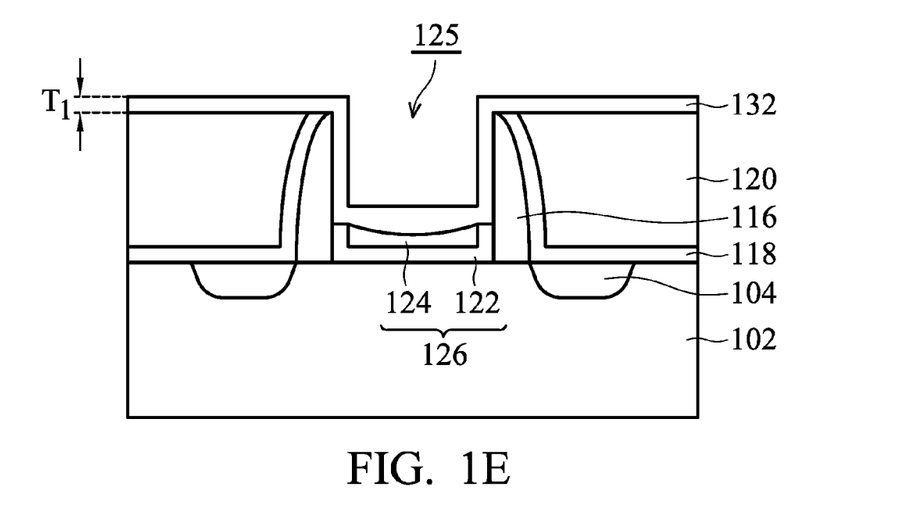

Afterwards, as shown in FIG. 1E, a protection layer 132 is conformally formed in the opening 125, in accordance with some embodiments of the disclosure. The protection layer 132 is used to protect the underlying layers, such as the gate structure 126, from being etched or damaged by the following processes. Therefore, the protection layer 132 is in direct contact with the spacer layer 116.

The protection layer 132 is formed along the shape of the opening 125, and thus the protection layer 132 formed on sidewall surfaces and a bottom surface of the opening 125. The protection layer 132 has a U-shaped structure when seen from a cross-sectional view.

It is a challenge to deposit conformal layers to fill very narrow openings, for example narrower than 30 nm, particularly when the opening has an aspect ratio greater than about 3:1 (depth:width). In order to deposit a conformal protection layer 132 into the opening 125, in some embodiments, the protection layer 132 is formed by an ALD process.

In some embodiments, the protection layer 132 is made of silicon nitride (SixNy), silicon oxynitride (SiON), silicon carbide (SiC), silicon carbon nitride (SiCN), another similar material, another suitable material, or a combination thereof. In some other embodiments, the protection layer 132 is formed by a CVD process, a spin-on process, another applicable process, or a combination thereof. In some embodiments, the protection layer 132 has a first thickness $T_1$ in a range from about 100 to about 150 angstrom (Å).

Figure 1F:
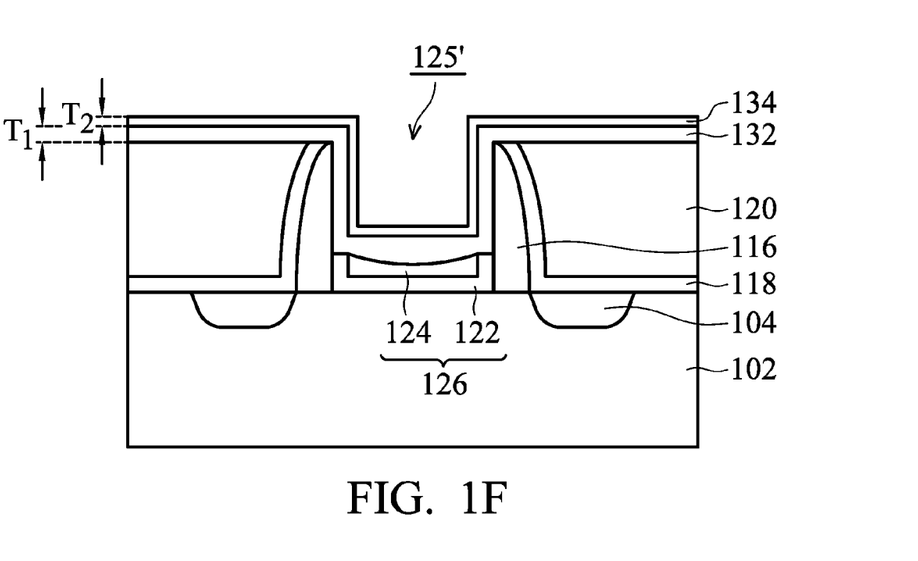

Afterwards, as shown in FIG. 1F, a stop layer 134 is conformally formed over the protection layer 132, in accordance with some embodiments of the disclosure. More specifically, the stop layer 134 is formed along the shape of the protection layer 132, and thus the stop layer 134 also has a U-shaped structure when seen from a cross-sectional view. The remaining opening 125' is formed over the stop layer 134.

The stop layer 134 is stronger than protection layer 132 in subsequent etching process to provide a second protection wall. The protection layer 132 has a first etching resistance, and the stop layer 134 has a second etching resistance which is greater than the first etching resistance. In other words, an etching rate of the protection layer 132 in an etching process is greater than an etching rate of the stop layer 134.

As mentioned above, in order to deposit a conformal stop layer 134 into the opening 125, in some embodiments, the stop layer 134 is formed by an ALD process. In some embodiments, the stop layer 134 is made of silicon oxycarbide (SiOC), silicon carbon nitride (SiCN), silicon oxynitride (SiON), siliconoxycarbonitride (SiOCN), another similar material, another suitable material, or a combination thereof. In some other embodiments, the stop layer 134 is formed by a CVD process, a spin-on process, another applicable process, or a combination thereof. In some embodiments, the stop layer 134 has a second thickness $T_2$ in a range from about 10 angstrom (Å) to about 20 angstrom (A). The second thickness $T_2$ of the stop layer 134 is smaller than the first thickness $T_1$ of the protection layer 132. If the second thickness $T_2$ is too small, the protection effect of the stop layer 134 may not be good enough. If the second thickness $T_2$ is too greater, the stop layer 134 may not be easily removed.

Figure 1G:
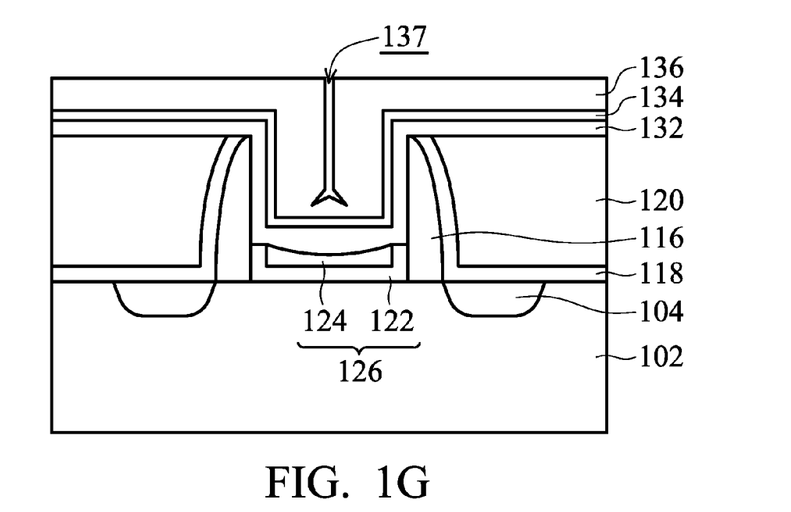

Afterwards, as shown in FIG. 1G, a first cap portion 136 is formed over the stop layer 134, in accordance with some embodiments of the disclosure. The remaining opening 125' is completed filled with the first cap portion 136.

As mention above, a conformal thin film may be obtained within a high aspect ratio opening by the ALD process. A numerous ALD cycles may be repeated to adequately fill the remaining opening 125' to form a number of ALD layers. Each of the ALD layers is very thin (e.g., about atomically thin monolayer). However, during performing the ALD process, the unwanted void, gap or seam 137 may be created in the middle portion of the first cap portion 136 where two sidewalls meet. The seam 137 may become a weak point, and the stress may concentrate on the seam 137. Therefore, a second cap portion 146 (shown in FIG. 1I) is formed over the first cap portion 136 to cover the seam 137.

As shown in FIG. 1G, the seam 137 is in the middle of the second cap portion 136, and the seam 137 is extended from lower the top surface of the ILD layer 120 to higher than the top surface of the ILD layer 120. In some embodiments, the seam 137 has a reverse Y-shaped structure when seen from a cross-sectional view, the reverse Y-shaped structure has a stem portion and two arms extended from the stem portion. In some other embodiments, the seam 137 has a stem main portion and a branch portion, and the size of the stem portion is greater than the branch portion. In some embodiments, the stem portion of the seam 137 has a top width in a range from about 1 nm to about 1.5 nm.

In some embodiments, the first cap portion 136 is made of silicon nitride (SixNy), silicon oxynitride (SiON), silicon carbide (SiC), silicon carbon nitride (SiCN), low-k material, another applicable material, or a combination thereof. In some other embodiments, the first cap portion 136 is formed by a CVD process, a spin-on process, another applicable process, or a combination thereof.

Figure 1H:
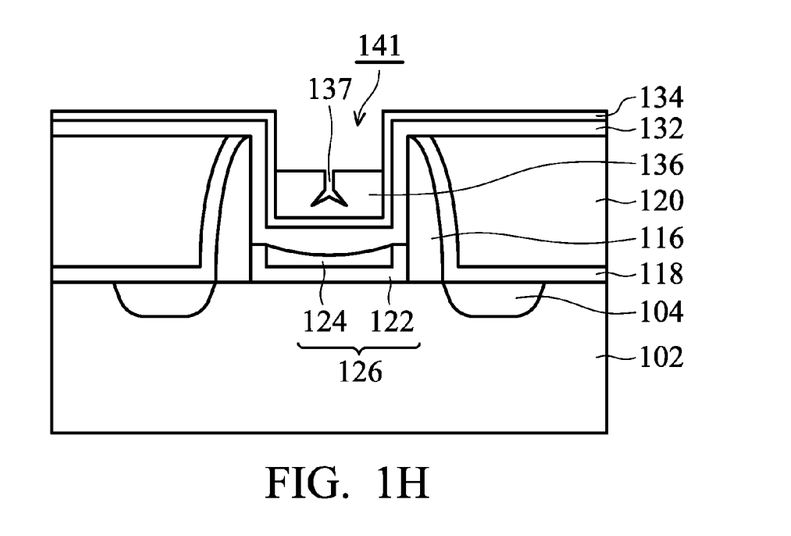

Afterwards, as shown in FIG. 1H, a portion of the first cap layer 134 is removed to form a recess 141 above the first cap layer 134, in accordance with some embodiments of the disclosure. More specifically, the portion of the first cap layer 134 is etched back by an etching process, such as a dry etching process. As a result, a top surface of the first cap portion 136 is lower than a top surface of the ILD layer 120 and lower than a top surface of the spacer layers 116. The recess 141 is surrounded by the first cap portion 136 and the stop layer 134. In addition, the seam 137 with a reverse Y-shaped structure is exposed.

As mentioned above, the stop layer 134 has a second etching resistance which is greater than the first etching resistance. When the first cap portion 136 is etched back, the stop layer 134 may be not removed.

Figure 1I:
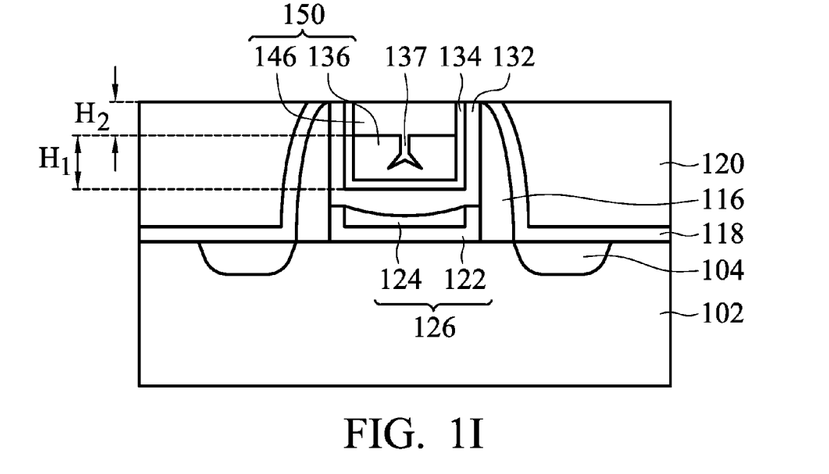

Next, as shown in FIG. 1I, a second cap portion 146 is formed in the recess 141 and over the ILD layer 120, in accordance with some embodiments of the disclosure. Next, a planarizing process, such as a chemical mechanical polishing (CMP) process or the like, is performed to remove the excess the second cap portion 146 outside of the recess 141. A cap layer 150 is constructed by the first cap portion 136 (also called a bottom cap portion) and the second cap portion 146 (also called a top cap portion). The second cap portion 146 is used to cover the unwanted seam 137 is the first cap portion 136. The top surface of the cap layer 150 is level with a top surface of the ILD layer 120. In addition, the unwanted seam 137 is embedded in the cap layer 150. The seam 137 with reverse Y-shaped structure is enclosed by the second cap portion 146.

In some embodiments, the second cap portion 146 is made of amorphous silicon, silicon nitride (SixNy), silicon oxynitride (SiON), silicon carbide (SiC), silicon carbon nitride (SiCN), another similar material, another suitable material, or a combination thereof. The first cap portion 136 and the second cap portion 146 are made of different materials, and an interface is between the first cap portion 136 and the second cap portion 146. In some embodiments, the first cap portion 136 is made of silicon nitride (SixNy), and the second cap portion 146 is made of amorphous silicon (Si).

The first cap portion 136 has a third etching resistance, and the second cap portion 146 has a fourth etching resistance that is greater than the third etching resistance. In addition, the fourth etching resistance of the second cap portion 146 is greater than the second etching resistance of the stop layer 134.

In some embodiments, the first cap portion 136 has a first height $H_1$, and the second cap portion 146 has a second height $H_2$. In some embodiments, the height ratio of the first height $H_1$ to the second height $H_2$ is in a range from about 0.9 to about 1.1. When the height ratio is within above-mentioned range, the protection of the second cap portion 146 is better to prevent the exposure of the seam.

As shown in FIG. 1I, a gate stack structure is formed over the substrate 102 and in the ILD layer 120. The gate stack structure includes a bottom portion and a top portion. The bottom portion includes the gate dielectric layer 122 and the gate electrode layer 124 surrounded by the gate dielectric layer 122. The top portion is used to protect the bottom portion from being etched during the subsequent etching process for forming a contact structure 160 (shown in FIG. 1K). The top portion includes the protection layer 132, the stop layer 134 and the cap layer 150 to provide multiple barriers. The cap layer 150 includes the first cap portion (or bottom cap portion) 136 and the second cap portion (or top cap portion) 146 over the first cap portion 136. When the seam 137 is formed in the first cap portion 136, the seam 137 is encapsulated or sealed by the second cap portion 146.

Figure 1J:
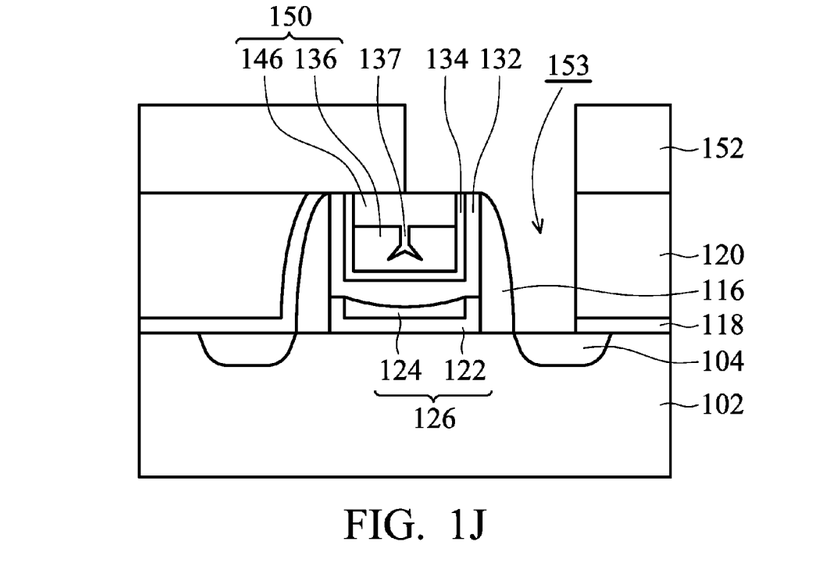

Next, as shown in FIG. 1J, a dielectric layer 152 is formed over the ILD layer 120, in accordance with some embodiments of the disclosure. The dielectric layer 152 includes a single layer or multiple dielectric layers. The dielectric layer 152 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 152 is formed by a chemical vapor deposition (CVD) process, a spin-on process, a sputtering process, or a combination thereof.

Afterwards, a portion of the dielectric layer 152 and a portion of the ILD layer 120 are removed to form a trench 153 by an etching process. In addition, a portion of the contact etching stop layer (CESL) 118 is removed. The trench 153 is used to form the contact structure 160 (shown in FIG. 1K) to electrically connect to the S/D structures 104.

It should be noted that when an etching process is performed to form the trench 153, the cap layer 150 is used as a barrier wall to protect the underlying layers, especially the gate structure 126, from being etched. Furthermore, the stop layer 134 and the protection layer 132 are also a barrier wall to further stop the etching process. The protection layer 132, the stop layer 134 and the cap layer 150 which are formed in sequence have a gradually increasing etching resistance to provide complete protection.

Figure 1K:
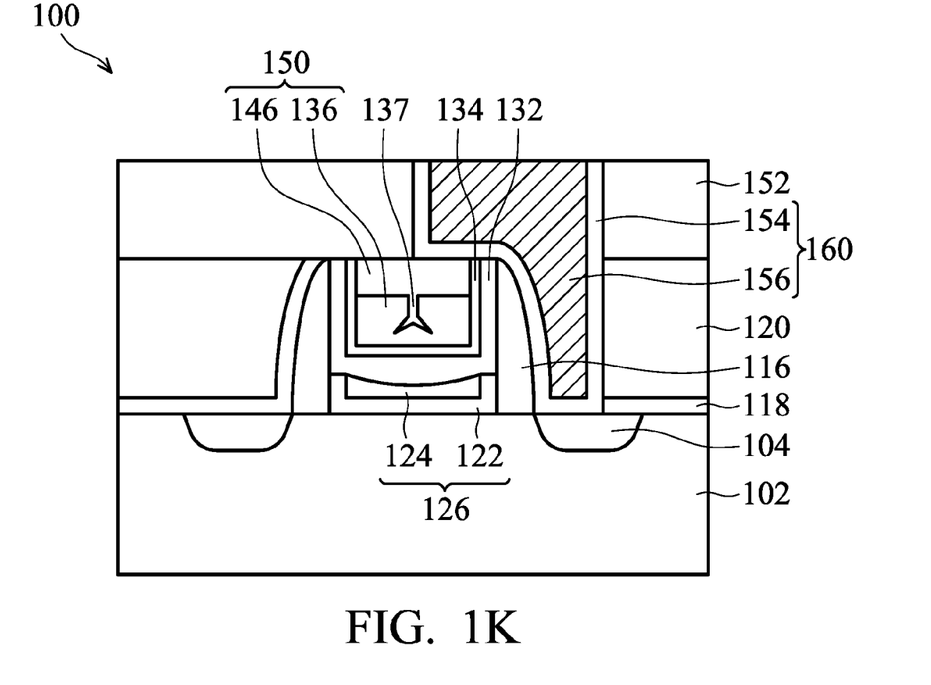

Afterwards, as shown in FIG. 1K, a diffusion barrier layer 154 is formed in the trench 153, and then the conductive material 156 is formed over the diffusion barrier layer 154, in accordance with some embodiments of the disclosure. Next, a planarizing process, such as a chemical mechanical polishing (CMP) process or the like, is performed to remove the excess conductive materials outside of the trench 153. The contact structure 160 includes the diffusion barrier layer 154 and the conductive material 156. The contact structure 160 is electrically connected to the S/D structures 104.

In some embodiments, the diffusion barrier layer 154 is made of Ta, TaN, Ti, TiN, CoW or another applicable material. In some embodiments, the diffusion barrier layer 154 is formed by a physically vapor deposition (PVD) process, an atomic layer deposition (ALD) process, or another applicable process. In some embodiments, the conductive material 156 is made of copper (Cu), copper alloy, aluminum (Al), aluminum alloys, tungsten (W), gold (Au), platinum (Pt), nickel (Ni), titanium (Ti), or another applicable materials, or a combination thereof. In some embodiments, conductive material 430 is formed by a CVD process, PVD process, electroplating, electroless plating process, or another applicable process.

The opening 125 above the gate structure 126 (as shown in FIG. 1D) is filled with different materials to form the top portion of the gate stack structure. The different materials have different etching resistance to provide multiple protections. For example, the top portion of the gate stack structure includes the protection layer 132, the stop layer 134 and the cap layer 150. The top portion is used to protect the underlying layers, such as the gate electrode layer 124, from being damaged by the subsequent etching process. Furthermore, the gap filling of the opening 125 (shown in FIG. 1D) with a high aspect ratio is divided into several steps to reduce the difficulty of gap filling.

FIGS. 2A-2E show cross-sectional representations of various stages of forming a semiconductor device structure 200, in accordance with some embodiments of the disclosure. Some processes and materials used to form the semiconductor device structure 100 are similar to, or the same as, those used to form the semiconductor structure 200 and are not repeated herein.

Figure 2A:
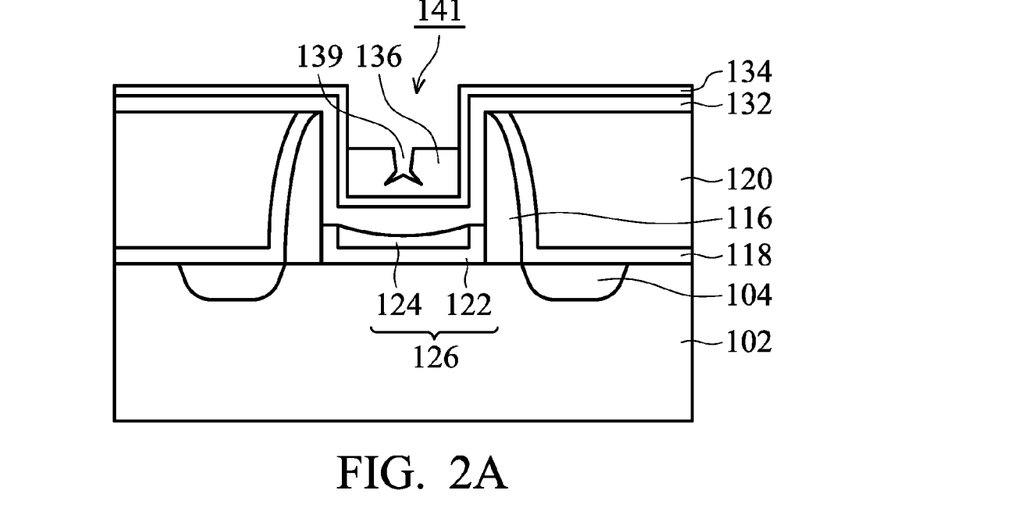
FIGS. 2A-2E show cross-sectional representations of various stages of forming a semiconductor device structure, in accordance with some embodiments of the disclosure.

As shown in FIG. 2A, the gate structure 126 is formed over the substrate 102, and the protection layer 132 is formed over the gate structure 126. Afterwards, the stop layer 134 is formed over the protection layer 132, and the protection layer 132 and the stop layer 134 both have a U-shaped structure when seen from a cross-sectional view. Next, the first cap portion 136 is formed over the stop layer 134. The first cap portion 136 is formed by an ALD process and has a gap 139 therein. When the first cap portion 136 is etched back, the gap 139 is exposed, and a recess 141 is over the first cap portion 136. In some embodiments, the gap 139 has a reverse Y-shaped structure with a stem portion and two arms extended from the stem portion. In some other embodiments, the gap 139 has a stem main portion and a branch portion, and the size of the stem main portion is greater than the branch portion.

In some embodiments, the first cap portion 136 is formed by an ALD process to form a conformal thin film. However, an unwanted gap 139 may be formed in the middle portion of the first cap portion 136. Compared with the seam 137 in FIG. 1I, the top width of the gap 139 in FIG. 2A is greater than that of the seam 137 in FIG. 1I, and thus the gap 139 may become a weak point, and the stress may concentrate on the gap 139. Therefore, cracks can occur due to the gap 139. In other words, the first cap portion 136 may be easily be removed or damaged due to the gap 139. In addition, unwanted contaminants may enter the gap 139. In order to resolve the issue of cracking, in the next step, a gap filling material 138 is formed in the gap 139. In some embodiments, the stem portion of the gap 139 has a top width in a range from about 3 nm to about 5 nm.

Figure 2B:
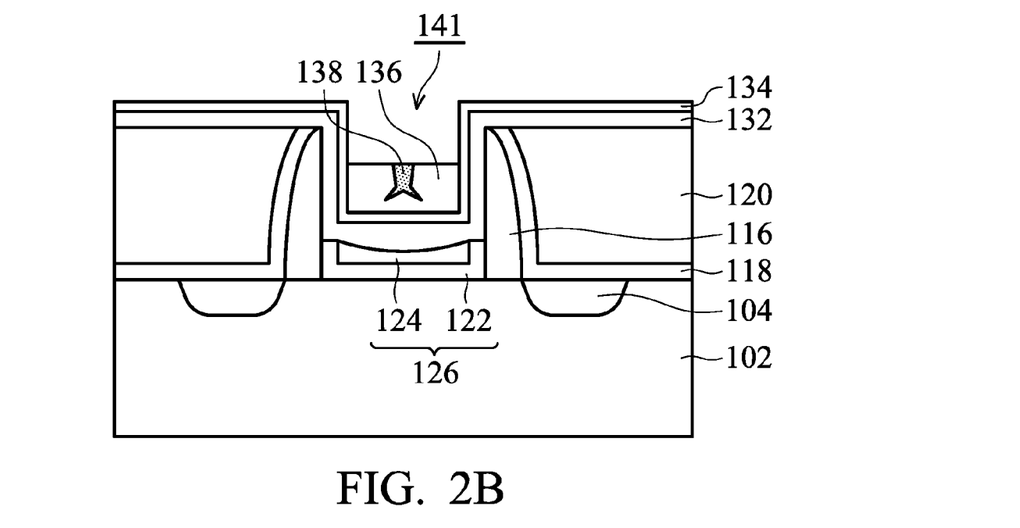

Next, as shown in FIG. 2B, in order to fill the gap 139, a gap filling material 138 is formed in the gap 139, in accordance with some embodiments of the disclosure. The gap filling material 138 is used to fill with the gap 139 to improve the strength of the gap 139. More specifically, the gap 139 has reverse Y-shaped structure with a stem portion and two arms, the stem portion is completely filled with the gap filling material 138. In addition, the arms may also be filled with the gap filling material 138. In some other embodiments, the arms are not filled with the gap filling material 138 due to the sizes of the arms being too small.

In some embodiments, the gap filling material 138 has a fifth etching resistance that is greater than the second etching resistance of the stop layer 134 to provide better protection.

In some embodiments, the gap filling material 138 has a fifth etching resistance that is lower than the fourth etching resistance of the top cap portion 146 to facilitate the removal of the gap filling material 138 in the subsequent process. In some embodiments, the top cap portion 146 and the gap filling material 138 are removed to form a contact structure, and the contact structure is used to electrically connect the gate structure 126.

In some embodiments, the gap filling material 138 is made of silicon nitride, silicon oxynitride, another suitable material or a combination thereof. In some embodiments, the gap filling material 138 is formed by a flowable chemical vapor deposition (FCVD) process, a spin-on dielectric (SOD) process, or another applicable process. In some embodiments, the FCVD process is suitable to fill the gaps/trenches of high aspect ratio without any void or seam formed therein. Therefore, the gap filling material is strong enough to sustain ensuing manufacturing processes. Afterwards, a densification process is performed to compact and strengthen the gap filling material 138. The densification process may include, for example but not limited to, a thermal process. In some other embodiments, the SOD process has the advantage of good gap filling ability in filling the gaps/trenches.

Figure 2C:
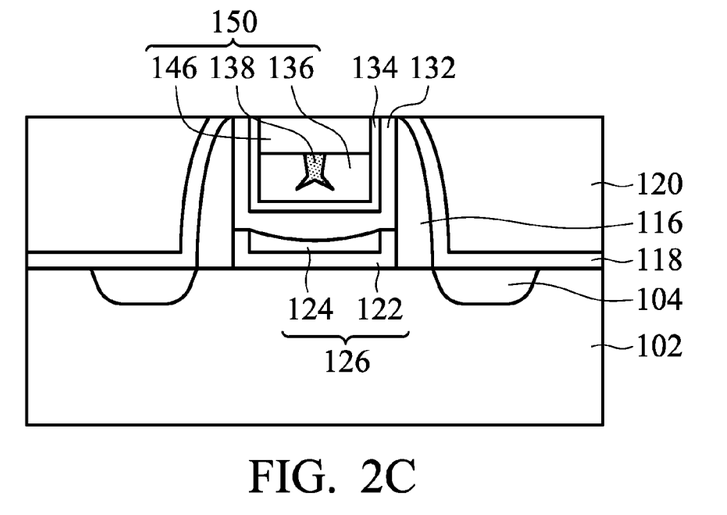

Afterwards, as shown in FIG. 2C, the second cap portion 146 is formed in the recess 141, in accordance with some embodiments of the disclosure. Next, a planarizing process, such as a chemical mechanical polishing (CMP) process or the like, is performed to remove the excess second cap portion 146 outside of the recess 141.

The cap layer 150 is constructed by the first cap portion 136 (also called a bottom cap portion), the gap filling material 138, and the second cap portion 146 (also called a top cap portion). The top surface of the cap layer 150 is level with a top surface of the ILD layer 120.

The first cap portion 136 and the second cap portion 146 are made of different materials, and an interface is between the first cap portion 136 and the second cap portion 146. In some embodiments, the first cap portion 136 is made of silicon nitride (SixNy), and the second cap portion 146 is made of amorphous silicon (Si). The first cap portion 136 has the third etching resistance, and the second cap portion 146 has a fourth etching resistance that is greater than the third etching resistance. In addition, the fourth etching resistance is greater than the second etching resistance of the stop layer 134.

Figure 2D:
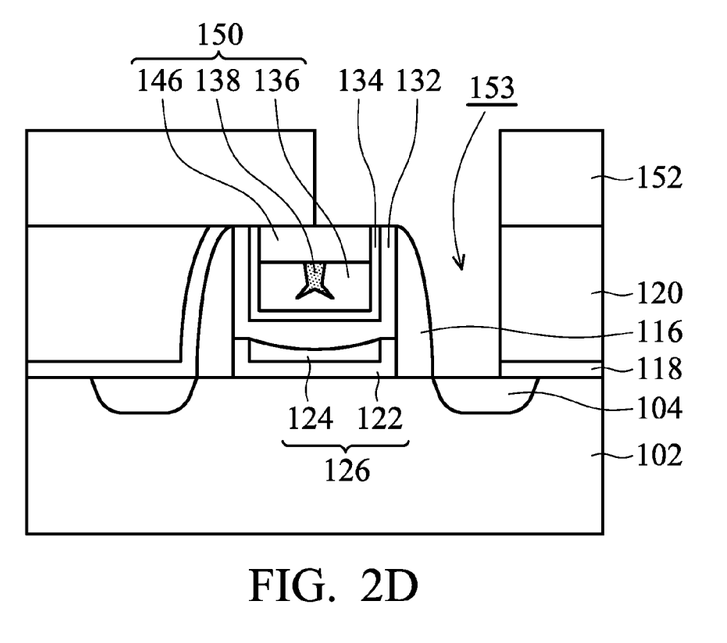

Afterwards, as shown in FIG. 2D, a dielectric layer 152 is formed over the ILD layer 120, in accordance with some embodiments of the disclosure. Afterwards, a portion of the dielectric layer 152 and a portion of the ILD layer 120 are removed to form the trench 153 by an etching process. In addition, a portion of the contact etching stop layer (CESL) 118 is removed.

Figure 2E:
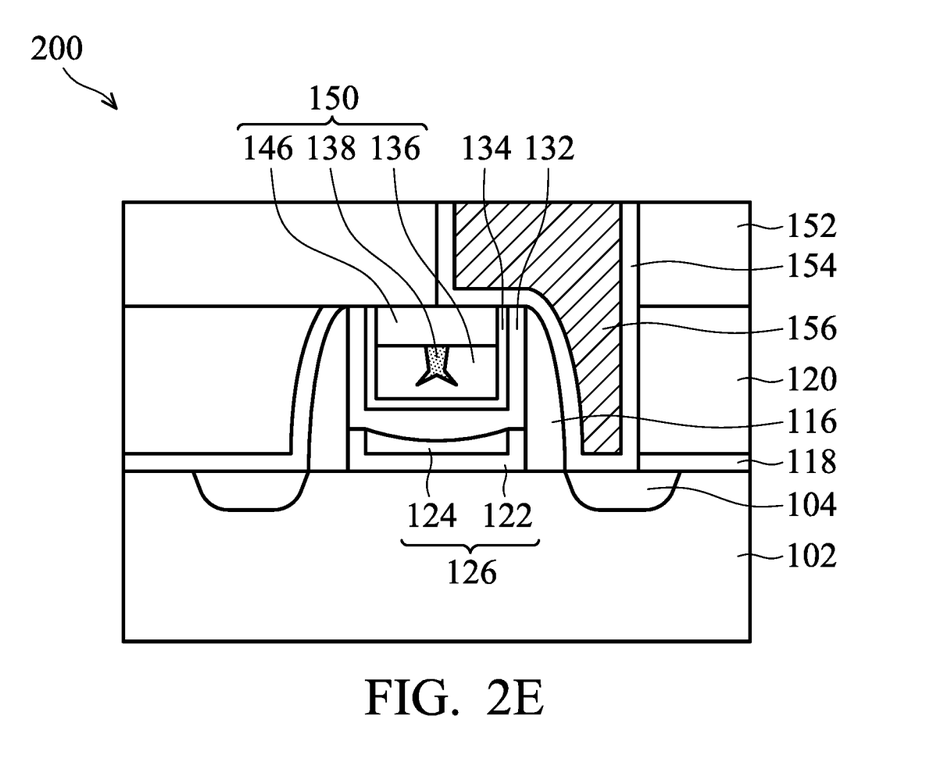

Afterwards, as shown in FIG. 2E, the diffusion barrier layer 154 is formed in the trench 153, and then the conductive material 156 is formed over the diffusion barrier layer 154, in accordance with some embodiments of the disclosure. Next, a planarizing process, such as a chemical mechanical polishing (CMP) process or the like, is performed to remove the excess conductive materials outside of the trench 153. The contact structure 160 includes the diffusion barrier layer 154 and the conductive material 156. The contact structure 160 is electrically connected to the S/D structures 104.

Compared with the second embodiments shown in FIGS. 2A-22E, the gap 139 is filled with the gap filling material 138 and cracking is reduced, even if the gap 139 has a size greater than the size of the seam 137 in the first embodiment shown in FIGS. 1A-1K. The gate stack structure includes a bottom portion and a top portion over the bottom portion. The top portion of the gate stack structure is used to protect the underlying layers, such as the gate electrode layer 124, from being damaged by the subsequent etching process. Furthermore, the gap filling of the opening 125 (shown in FIG. 1D) with a high aspect ratio is divided into several steps to reduce the difficulty of gap filling.

Embodiments for forming a semiconductor device structure are provided. The semiconductor structure includes a gate stack structure formed over a substrate. The gate stack structure includes a bottom portion and a top portion over the bottom portion. The bottom portion includes a gate electrode layer and the top portion is used to prevent the bottom portion being damaged by the subsequent process. The top portion includes a stop layer sandwiched between the protection layer and the cap layer, and the cap layer includes a bottom cap portion and a top cap portion. The protection layer, the top layer and the cap layer are used as a barrier wall to protect the underlying layers. In addition, when a gap is formed in the cap layer, a gap filling material is filled into the gap to increase the strength of the gap. The top portion of the gate stack structure provides strong protection to protect the gate electrode. Furthermore, the filling of the gap with a high aspect ratio is divided into several steps to reduce the difficulty of filling the gap. Therefore, the performance of the semiconductor device structure is improved.

In some embodiments, a semiconductor device structure is provided. The semiconductor device structure includes a gate stack structure formed over a substrate, and the gate stack structure includes a bottom portion and a top portion. The bottom portion includes a gate electrode layer formed over a substrate. The top portion includes a protection layer formed over the gate electrode layer, a stop layer formed over the protection layer, and the stop layer is surrounded by the protection layer. A cap layer is formed over the stop layer, and the cap layer is surrounded by the stop layer.

In some embodiments, a semiconductor device structure is provided. The semiconductor device structure includes a gate electrode layer formed over a substrate and a stop layer formed over the gate electrode layer. The semiconductor device structure includes a cap layer formed over the stop layer. The cap layer includes a bottom cap portion, and a gap is formed in the bottom cap portion, a gap filling material formed in the gap, and a top cap portion formed over the gap filling material and the bottom cap portion.

In some embodiments, a method for forming a semiconductor device structure is provided. The method includes forming a dielectric layer over the substrate and forming a trench in the dielectric layer. The method includes forming a gate electrode layer in the trench and removing a portion of the gate electrode layer to form an opening over the gate electrode layer. The method also includes conformally forming a protection layer in the opening and conformally forming a stop layer over the protection layer. The method further includes conformally forming a cap layer over the stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a gate stack structure formed over a substrate, wherein the gate stack structure comprises a bottom portion and a top portion, wherein the bottom portion comprises a gate electrode layer formed over a substrate,
wherein the top portion comprises:
a protection layer formed over the gate electrode layer;
a stop layer formed over the protection layer, wherein the stop layer is surrounded by the protection layer; and
a cap layer formed over the stop layer, wherein the cap layer is surrounded by the stop layer, the cap layer comprises a bottom cap portion and a top cap portion, the bottom cap portion and the top cap portion are made of different materials, and an interface is between the bottom cap portion and the top cap portion.

2. The semiconductor device structure as claimed in claim 1, further comprising:
a spacer layer formed on a sidewall of the gate stack structure, wherein the spacer layer is in direct contact with the protection layer.

3. The semiconductor device structure as claimed in claim 1, wherein the protection layer has a first etching resistance, and the stop layer has a second etching resistance that is greater than the first etching resistance.

4. The semiconductor device structure as claimed in claim 1, wherein the bottom cap portion has a third etching resistance, and the top cap portion has a fourth etching resistance that is greater than the third etching resistance.

5. The semiconductor device structure as claimed in claim 4, wherein the fourth etching resistance of the top cap portion of the cap layer is greater than the second etching resistance of the stop layer.

6. The semiconductor device structure as claimed in claim 1, wherein a gap is formed in the cap layer, and the gap is embedded in the cap layer.

7. The semiconductor device structure as claimed in claim 6, wherein the gap has a reverse Y-shaped structure with a stem portion and two arms extended from the stem portion.

8. The semiconductor device structure as claimed in claim 1, wherein the bottom portion further comprises a gate dielectric layer formed over the substrate, and the gate electrode layer is surrounded by the gate dielectric layer.

9. The semiconductor device structure as claimed in claim 1, wherein the protection layer has a U-shaped structure when seen from a cross-sectional view, and the stop layer is conformally formed over the protection layer and has a U-shaped structure when seen from a cross-sectional view.

10. A semiconductor device structure, comprising:
a gate electrode layer formed over a substrate;
a stop layer formed over the gate electrode layer; and
a cap layer formed over the stop layer, wherein the cap layer comprises:
a bottom cap portion, wherein a gap is formed in the bottom cap portion;
a gap filling material formed in the gap; and
a top cap portion formed over the gap filling material and the bottom cap portion.

11. The semiconductor device structure as claimed in claim 10, wherein the gap has a reverse Y-shaped structure with a stem portion, and the gap filling material is filled with the stem portion.

12. The semiconductor device structure as claimed in claim 10, wherein the bottom cap portion and the top cap portion are made of different materials, and an interface is between the bottom cap portion and the top cap portion.

13. The semiconductor device structure as claimed in claim 10, further comprising:
a protection layer formed over the gate electrode layer, wherein the protection layer has a U-shaped structure when seen from a cross-sectional view, and the stop layer is conformally formed over the protection layer and has a U-shaped structure when seen from a cross-sectional view.

14. The semiconductor device structure as claimed in claim 13, wherein the protection layer has a first etching resistance, the stop layer has a second etching resistance that is greater than the first etching resistance, the bottom cap portion has a third etching resistance, the top cap portion has a fourth etching resistance that is greater than the third etching resistance, and the fourth etching resistance is greater than the second etching resistance.

15. A semiconductor device structure, comprising:
a gate electrode layer formed over a substrate;
a protection layer formed over the gate electrode layer, wherein the protection layer has a U-shaped structure when seen from a cross-sectional view;
a stop layer formed over the protection layer, wherein the stop layer has a U-shaped structure when seen from a cross-sectional view; and
a cap layer formed over the stop layer, wherein the cap layer comprises:
a bottom cap portion; and
a top cap portion formed over the bottom cap portion, wherein the bottom cap portion and the top cap portion are made of different materials, and an interface is between the bottom cap portion and the top cap portion.

16. The semiconductor device structure as claimed in claim 15, wherein a gap is formed in between the bottom cap portion and the top cap portion, and a gap filling material is formed in the gap.

17. The semiconductor device structure as claimed in claim 16, wherein a top surface of the gap filling material is level with the interface.

18. The semiconductor device structure as claimed in claim 16, wherein a top surface of the gate electrode layer has a recessed surface with a lowest point, and the gap filling material is directly above the lowest point of the recessed surface.

19. The semiconductor device structure as claimed in claim 15, wherein the protection layer has a first etching resistance, the stop layer has a second etching resistance that is greater than the first etching resistance, the bottom cap portion has a third etching resistance, the top cap portion has a fourth etching resistance that is greater than the third etching resistance, and the fourth etching resistance is greater than the second etching resistance.

* * * * *